(12) United States Patent
Shimai

(10) Patent No.: US 7,975,997 B2
(45) Date of Patent: Jul. 12, 2011

(54) SUPPORTING PIN

(75) Inventor: Futoshi Shimai, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 1056 days.

(21) Appl. No.: 11/820,715

(22) Filed: Jun. 20, 2007

(65) Prior Publication Data

US 2008/0124207 A1 May 29, 2008

(30) Foreign Application Priority Data

Jun. 20, 2006 (JP) ................................. 2006-169535

(51) Int. Cl.
*B25B 1/24* (2006.01)

(52) U.S. Cl. ........... 269/53; 269/8; 269/266; 269/289 R; 118/500

(58) Field of Classification Search ............ 269/21, 269/20, 266, 289 R, 301.1, 900, 901; 248/188.2, 248/188.5, 309.2, 354.5; 74/527, 526, 567; 118/500, 503, 52, 612, 319, 320; 451/285–290, 451/397–400, 411–413
See application file for complete search history.

(56) References Cited

U.S. PATENT DOCUMENTS

| | | | | |
|---|---|---|---|---|
| 2,439,854 A * | 4/1948 | Lipski | ............ | 248/352 |
| 2,906,490 A * | 9/1959 | Russell | ............ | 248/354.5 |
| 4,187,751 A * | 2/1980 | Barnacle | ............ | 83/458 |
| 4,200,272 A * | 4/1980 | Godding | ............ | 269/26 |
| 5,326,085 A * | 7/1994 | Codatto | ............ | 269/20 |
| 5,501,762 A * | 3/1996 | Marschke et al. | ............ | 156/470 |
| 5,766,409 A * | 6/1998 | Krznarich et al. | ............ | 156/470 |
| 6,029,966 A * | 2/2000 | Hertz et al. | ............ | 269/266 |
| 6,158,727 A * | 12/2000 | Fox | ............ | 269/20 |
| 6,250,619 B1 * | 6/2001 | Cook et al. | ............ | 269/20 |
| 6,461,465 B2 * | 10/2002 | Tada et al. | ............ | 156/228 |
| 6,497,403 B2 * | 12/2002 | Ries | ............ | 269/266 |
| 6,550,988 B2 * | 4/2003 | Sugimoto et al. | ............ | 396/564 |
| 6,555,047 B1 * | 4/2003 | Fortin | ............ | 264/544 |
| 6,775,904 B1 * | 8/2004 | Duebel | ............ | 29/760 |
| 6,953,188 B2 * | 10/2005 | Siegel | ............ | 269/266 |
| 7,416,176 B2 * | 8/2008 | Hamann | ............ | 269/266 |
| 2002/0100419 A1 * | 8/2002 | Nagashima | ............ | 118/722 |
| 2005/0269757 A1 * | 12/2005 | Stevenson et al. | ............ | 269/266 |

FOREIGN PATENT DOCUMENTS

| | | |
|---|---|---|
| JP | 2000-012655 | 1/2000 |
| JP | 2003-218003 | 7/2003 |

\* cited by examiner

*Primary Examiner* — George Nguyen
(74) *Attorney, Agent, or Firm* — Carrier Blackman & Associates, P.C.; Joseph P. Carrier; William D. Blackman

(57) ABSTRACT

A supporting pin which can cancel thermal expansion of a mounting table (hot plate) includes an upper supporting pin and a lower supporting pin, wherein the upper supporting pin and the lower supporting pin are independent of each other, the upper supporting pin is retained by the penetrating hole of the mounting table, and the lower supporting pin is attached to an elevator mechanism. Since the lower end of the upper supporting pin and the upper end of the lower supporting pin are in contact with each other, the operation of the supporting pin can be normally performed even when thermal expansion of the hot plate occurs.

10 Claims, 5 Drawing Sheets

PRIOR ART

SUPPORTING PIN

CROSS-REFERENCE TO RELATED APPLICATIONS

The present application claims priority from Japanese patent application 2006-169535, filed 20 Jun. 2006. The entire disclosure of the referenced priority document is incorporated herein by reference.

BACKGROUND OF THE INVENTION

1. Field of the Invention

The present invention relates to a supporting pin for supporting and delivering a substrate such as a glass substrate or a semiconductor wafer.

2. Description of the Related Art

In order to form a resist film or a color filter film on a glass substrate in a conventional method for manufacturing a liquid crystal display (LCD), a material for the film (coating liquid) is applied onto a surface of the glass substrate, and the coating liquid is heated within a heat treatment apparatus so as to form the film. As shown in FIG. 5, a supporting pin 102 is provided so as to be elevated or lowered in a penetrating hole 101 formed in the hot plate 100 in the vertical direction. In order to deliver the glass substrate onto the hot plate of the heat treatment apparatus, the supporting pin 102 is elevated above the upper surface of the hot plate 100, and the glass substrate W is delivered onto the upper end of the supporting pin 102, thereafter the supporting pin 102 is lowered so as to mount the glass substrate W on the hot plate 100.

There has been disclosed a technique for improving the above-described supporting pin in Patent Document 1 and Patent Document 2. Specifically, Patent Document 1 has disclosed a heat treatment apparatus for performing heat treatment in a state where a substrate is mounted on a supporting pin made of polyimide resin. Patent Document 2 has disclosed a heat treatment apparatus in which a supporting pin made of a fibrous material is provided on a base formed on a delivery arm, so that heat stored above the substrate is transferred from the supporting pin while diffused and the trace of the supporting pin left on the substrate is made de minimis compared to the conventional art.

Patent document 1: Japanese Patent Application publication No. 2003-218003

Patent document 2: Japanese Patent Application publication No. 2000-012655

When electricity is applied to the hot plate, the temperature of the hot plate itself becomes too high, which causes thermal expansion of the hot plate. A plurality of penetrating holes for inserting a supporting pin are formed in the hot plate such that the penetrating holes are equally arranged with respect to the whole area of the upper surface of the hot plate. If thermal expansion of the hot plate occurs in this structure, the penetrating holes located in the area other than the central area are moved toward the outside. Consequently, the side surface of the penetrating hole butts against the supporting pin, which causes the supporting pin to be bent and makes it difficult for the supporting pin to be elevated and lowered smoothly. In some cases, the supporting pin cannot be elevated and lowered with respect to the penetrating hole.

SUMMARY OF THE INVENTION

In order to solve the above-mentioned drawback, according to the present invention, there is provided at least one supporting pin having a structure in which the supporting pin is divided into an upper supporting pin and a lower supporting pin which are independent of each other, the upper supporting pin is retained by a penetrating hole of a mounting table, and the lower supporting pin is attached to an elevator mechanism.

A receiver member having a larger diameter than the upper supporting pin or the lower supporting pin may be provided at the lower end of the upper supporting pin or at the upper end of the lower supporting pin. With this, it is possible to securely transmit the elevated or lowered motion of the lower supporting pin to the upper supporting pin even if the axes of the upper supporting pin and the lower supporting pin are greatly displaced with each other.

Also, an elastic member for pushing the upper supporting pin downward may be provided. With this, it is possible to prevent the upper portion of the upper supporting pin from remaining projected from the penetrating hole when the lower supporting pin is lowered.

While a substrate to be treated is treated, a flange portion for stopping the upper supporting pin blocks the penetrating hole of the mounting table by being engaged with the penetrating hole. Accordingly, it is possible to prevent air from entering the penetrating hole from below so as to prevent non-uniformity from occurring.

In addition, the lower end of the upper supporting pin and the upper end of the lower supporting pin can be attracted by a magnet. As a specific structure, a magnet may be provided at both the lower end of the upper supporting pin and the upper end of the lower supporting pin. Alternatively, it is possible to provide a magnet at one end, and a magnetic member at another end. With this, when the lower supporting pin is lowered, the upper supporting pin is also lowered, and the displacement in the lateral direction between the upper supporting pin and the lower supporting pin can be tolerated. Incidentally, the strength of the magnet is adjusted such that the upper supporting pin can be displaced in the lateral direction.

It is also possible to couple the upper supporting pin and the lower supporting pin with a universal joint.

According to the present invention, even if the penetrating hole to which the supporting pin is inserted is distorted due to thermal expansion of the mounting table, since the supporting pin is divided into the upper supporting pin and the lower supporting pin, only the upper supporting pin moves corresponding to the distortion of the penetrating hole, so that it is possible to prevent the entire supporting pin from being bent and it is also possible to prevent the supporting pin from being interrupted by butting against the internal surface of the penetrating hole.

DETAILED DESCRIPTION OF THE PREFERRED EMBODIMENTS

Figure 1:
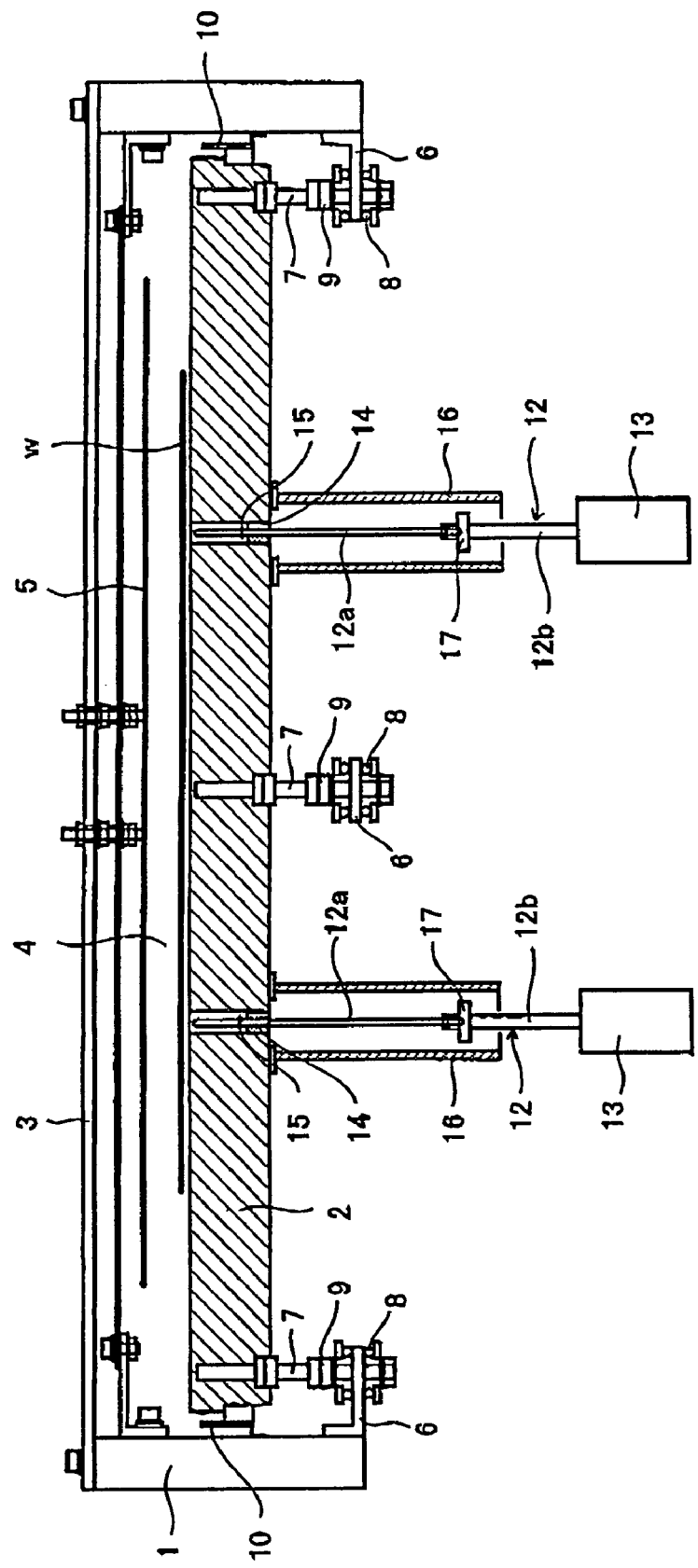
FIG. 1 is a whole view of a heat treatment apparatus using a supporting pin according to the present invention.

Embodiments of the present invention will now be explained with reference to the accompanying drawings. FIG.

1 is a sectional view showing the whole heat treatment apparatus using the supporting pin according to the present invention. In the heat treatment apparatus, a hot plate 2 is provided as a mounting table in the internal area surrounded by front and back, and left and right walls 1, and a space between a ceiling plate 3 and the hot plate 2 is a heat treatment space 4.

A straightening vane 5 is attached to the lower surface of the ceiling plate 3 so as to reduce the gap with respect to a substrate (glass substrate) W mounted on the upper surface of the hot plate 2. With this, it is possible to prevent a turbulence flow from occurring around the substrate W during heat treatment.

A plurality of brackets 6 are projected from the walls 1 toward the inside. Screw bars 7 are supported on the brackets 6 with bearings 8, and the hot plate 2 is supported by the screw bars 7. Since the screw bars 7 are supported with the bearings 8, if the hot plate 2 undergoes thermal expansion, the hot plate 2 can move toward the side accordingly. Also, the vertical position of the screw bar 7 can be changed by rotating a nut 9, so that the height position of the hot plate 2 can be adjusted, and the hot plate 2 can keep its horizontal state as a whole.

Partition walls 10 are provided around the hot plate 2. With this, even if the hot plate 2 expands or shrinks due to heat, it is possible to prevent cool water from entering from outside and prevent heat inside the treatment space 4 from being released to outside.

A plurality of penetrating holes 11 are formed in the hot plate 2 so as to be equally positioned from a plane view. Supporting pins 12 are inserted into the penetrating holes 11 in a state of being movable vertically.

The supporting pins 12 deliver a substrate W to the hot plate 2 and remove the substrate W from the hot plate 2. Specifically, an untreated substrate W is delivered to the treatment space 4 with a delivery arm which is not shown in the drawings in a state where the upper ends of the supporting pins 12 are projected from the penetrating holes 11. The delivery arm is lowered so as to mount the substrate W on the upper ends of the supporting pins 12 which are projected from the penetrating holes 11. Next, the supporting pins 12 are lowered so as to deliver the untreated substrate W to the upper surface of the hot plate 12. After heat treatment is finished, the substrate W is removed from the heat apparatus by reverse operation.

According to the present invention, the supporting pin 12 is divided into an upper supporting pin 12a and a lower supporting pin 12b which are independent of each other. The upper supporting pin 12a is retained in the penetrating hole 11 of the hot plate 2, and the lower supporting pin 12b is attached to an elevator mechanism 13 such as a cylinder unit.

More specifically, a guide 14 is provided in the penetrating hole 11, and the upper supporting pin 12a is inserted into the guide 14 in a slidable manner. Further, an engaging portion 15 is provided in the upper portion of the upper supporting pin 12a so as to be engaged with the upper end of the guide 14 and stop falling downward.

Also, the lower portion of the upper supporting pin 12a and the upper portion of the lower supporting pin 12b are housed in a tubular member 16. A receiver member 17 having a larger diameter than the upper supporting pin 12a and the lower supporting pin 12b is provided at the lower end of the upper supporting pin 12a. Although the receiver 17 is not essential, it is possible to securely transmit the motion of the lower supporting pin 12b to the upper supporting pin 12a even in a case where the axes of the upper supporting pin 12a and the lower supporting pin 12b are greatly displaced due to large thermal expansion of the hot plate 2 with the provision of the receiver 17.

Figure 2A:
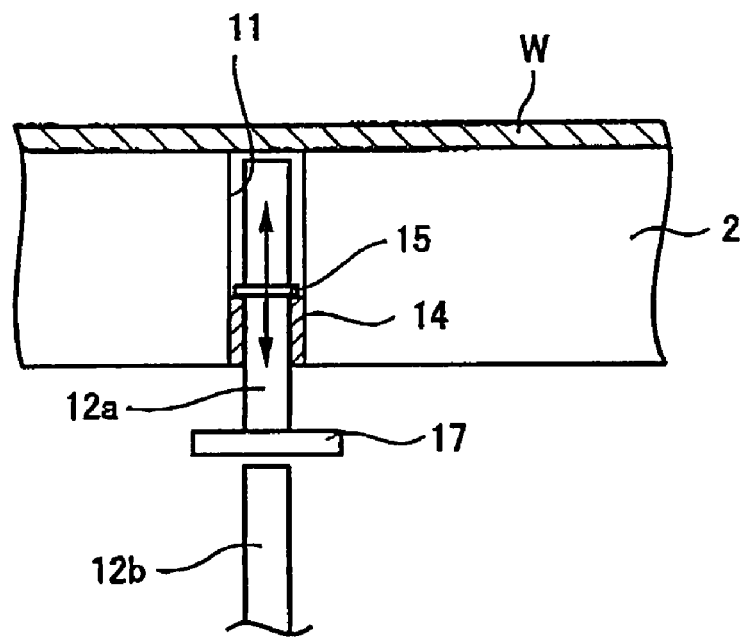
FIGS. 2 (*a*) and (*b*) are an enlarged sectional view of the main part of the heat treatment apparatus.
Figure 2B:
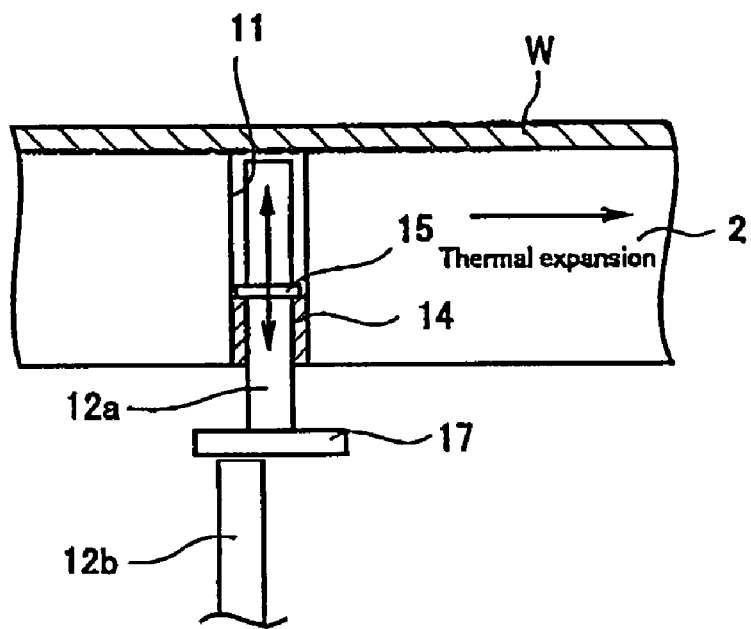

In the above structure, in a case where no thermal expansion of the hot plate 2 occurs, the axes of the upper supporting pin 12a and the lower supporting pin 12b coincide as shown in FIG. 2(a). However, in a case where the position of the penetrating hole 11 is moved due to thermal expansion of the hot plate 2, the upper supporting pin 12a is also moved corresponding to the penetrating hole 11, which causes the axes of the upper supporting pin 12a and the lower supporting pin 12b to be displaced with each other as shown in FIG. 2(b). However, since the lower end of the upper supporting pin 12a and the upper end of the lower supporting pin 12b are in contact with each other, the operation of the supporting pin 12 can be normally performed.

Also, while the substrate W undergoes treatment, the engaging portion 15 having a ring shape is engaged with the upper end of the guide 14 so as to prevent air from entering the penetrating hole 11 from below. Consequently, it is possible to prevent the trace of the penetrating hole 11 from being left on a film formed on the surface of the substrate W.

Figure 3:
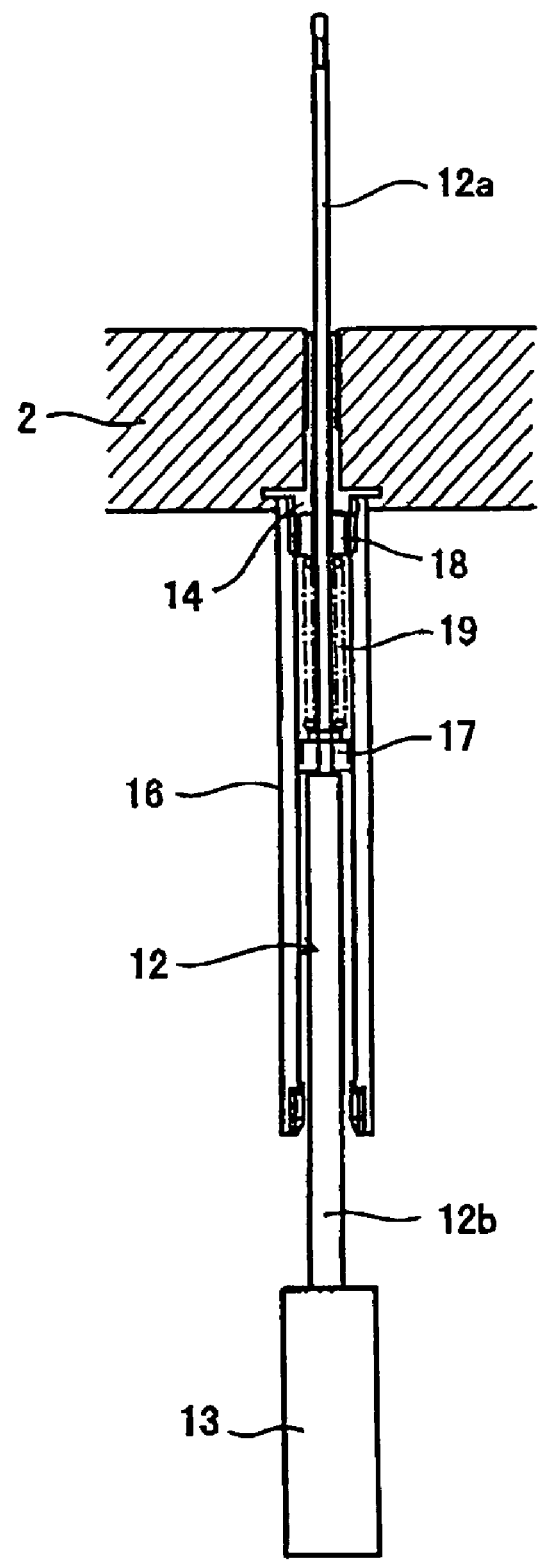
FIG. 3 is an enlarged sectional view of the main part of a heat treatment apparatus according to another embodiment.

FIG. 3 is an enlarged sectional view of the main part of a heat treatment apparatus according to another embodiment. In this embodiment, a spring (elastic member) 19 is interposed between the receiver 17 and a bush 18 provided at the lower end of the penetrating hole 11 so as to push the upper supporting pin 12a downward. In the present invention, since the supporting pin 12 is divided into the upper supporting pin 12a and the lower supporting pin 12b which are independent of each other, there is a little likelihood that the upper end of the upper supporting pin 12a remains projected even if the lower supporting pin 12b is lowered. However, with the provision of the spring 19, it is possible to prevent that from occurring.

Figure 4:
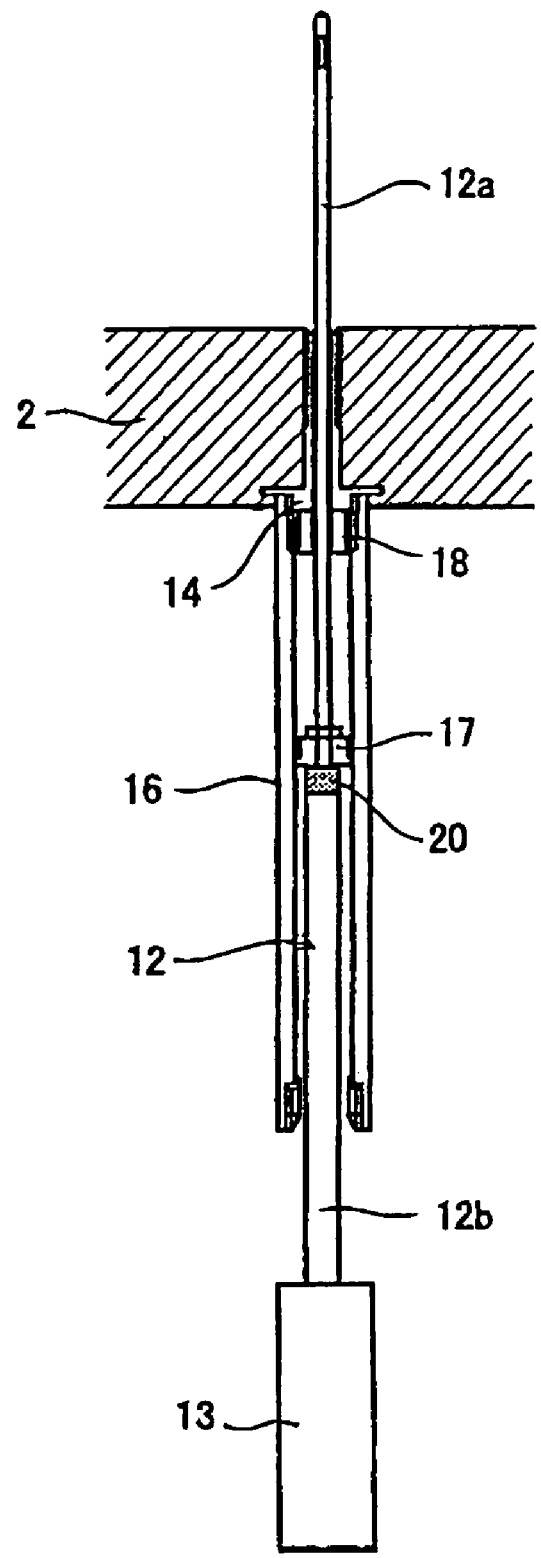
FIG. 4 is an enlarged sectional view of the main part of a heat treatment apparatus according to another embodiment.
Figure 5:
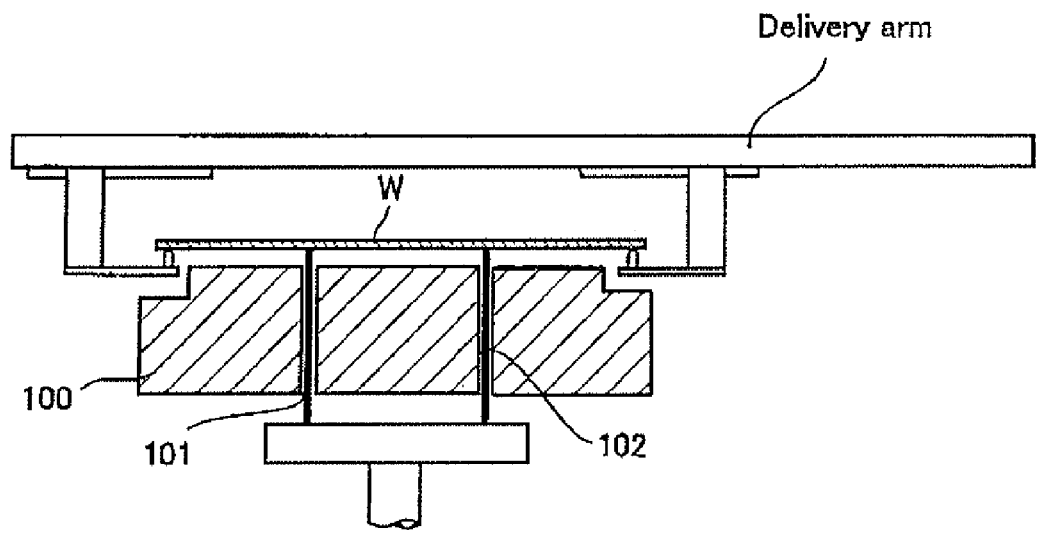
FIG. 5 is a whole view of a heat treatment apparatus using a conventional supporting pin.
Figure 6:
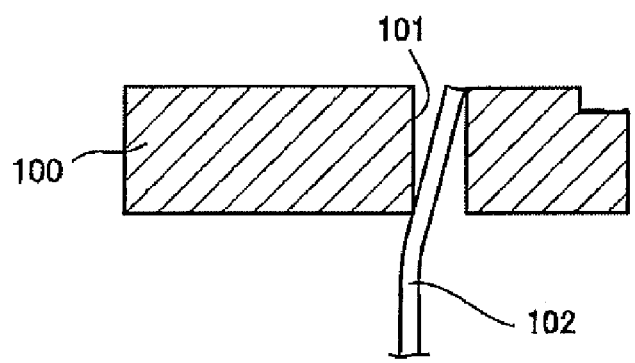
FIG. 6 is an enlarged view depicting a drawback of the heat treatment apparatus using a conventional supporting pin.

FIG. 4 is an enlarged sectional view of the main part of a heat treatment apparatus according to another embodiment. In this embodiment, a magnet 20 is provided at the lower end of the upper supporting pin 12a so as to allow the upper supporting pin 12a and the lower supporting pin 12b to attract each other by the magnet 20. With this, when the lower supporting pin 12b is lowered, the upper supporting pin 12a is also lowered. Also, the displacement in the lateral direction between the upper supporting pin 12a and the lower supporting pin 12b due to thermal expansion can be tolerated.

Although there have been described what are the present embodiments of the invention, it will be understood that variations and modifications may be made thereto within the spirit and scope of the invention as reflected in the appended claims.

What is claimed is:

1. A supporting pin to be elevated and lowered with respect to a penetrating hole formed in a mounting table comprising:
   an upper supporting pin;
   a lower supporting pin which operatively cooperates with the upper supporting pin; and
   a magnet which attracts the upper supporting pin and the lower supporting pin together,
   wherein the upper supporting pin and the lower supporting pin are independent of each other, the upper supporting pin is retained by the penetrating hole of the mounting table, and the lower supporting pin is attached to an elevator mechanism.

2. A supporting pin to be elevated and lowered with respect to a penetrating hole formed in a mounting table comprising:
   an upper supporting pin;
   a lower supporting pin which operatively cooperates with the upper supporting pin; and
   a receiver member having a larger diameter than the upper supporting pin or the lower supporting pin and provided between the upper and lower supporting pins at the lower end of the upper supporting pin or at the upper end of the lower supporting pin, wherein the upper supporting pin and the lower supporting pin are independent of each other, the upper supporting pin is retained by the penetrating hole of the mounting table, and the lower supporting pin is attached to an elevator mechanism.

3. A supporting pin to be elevated and lowered with respect to a penetrating hole formed in a mounting table comprising:

an upper supporting pin;

a lower supporting pin which operatively cooperates with the upper supporting pin; and an elastic member for pushing the upper supporting pin downward, wherein the upper supporting pin and the lower supporting pin are independent of each other, the upper supporting pin is retained by the penetrating hole of the mounting table, and the lower supporting pin is attached to an elevator mechanism.

4. The supporting pin according to claim 1, wherein the mounting table is supported on a fixed frame with a bearing in a movable manner in a horizontal direction.

5. The supporting pin according to claim 2, further comprising an elastic member for pushing the upper supporting pin downward.

6. The supporting pin according to claim 2, further comprising a magnet which attracts the upper supporting pin and the lower supporting pin together.

7. The supporting pin according to claim 2, wherein the mounting table is supported on a fixed frame with a bearing in a movable manner in a horizontal direction.

8. The supporting pin according to claim 3, wherein the mounting table is supported on a fixed frame with a bearing in a movable manner in a horizontal direction.

9. The supporting pin according to claim 5, wherein the mounting table is supported on a fixed frame with a bearing in a movable manner in a horizontal direction.

10. The supporting pin according to claim 6, wherein the mounting table is supported on a fixed frame with a bearing in a movable manner in a horizontal direction.

* * * * *